United States Patent
Juneja

(10) Patent No.: US 6,406,936 B1
(45) Date of Patent: Jun. 18, 2002

(54) METHOD FOR INCREASING TRACE ROWS OF A BALL GRID ARRAY

(75) Inventor: Nitin Juneja, Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 8 days.

(21) Appl. No.: 09/735,980

(22) Filed: Dec. 13, 2000

(51) Int. Cl.[7] .......................... H01L 21/44; H01L 21/48; H01L 21/50
(52) U.S. Cl. ....................................... 438/106; 257/678
(58) Field of Search .................. 438/106; 361/777; 257/773, 730, 688

(56) References Cited

U.S. PATENT DOCUMENTS

| | | | | |
|---|---|---|---|---|
| 4,495,377 A | * | 1/1985 | Johnson et al. | 174/68.5 |
| 5,767,575 A | * | 6/1998 | Lan et al. | 257/701 |
| 5,784,262 A | * | 7/1998 | Sherman | 361/777 |
| 6,051,890 A | * | 4/2000 | Mozdzen | 257/784 |
| 6,198,635 B1 | * | 3/2001 | Shenoy et al. | 361/777 |
| 6,310,398 B1 | * | 10/2001 | Katz | 257/773 |

* cited by examiner

*Primary Examiner*—David Nelms
*Assistant Examiner*—Andy Huynh
(74) *Attorney, Agent, or Firm*—Fitch, Even, Tabin & Flannery

(57) ABSTRACT

A method of making a ball grid array package includes the steps of (a) laying out an even I/O pad row and an odd I/O pad row of m I/O pads each for a ball grid array package wherein m is a positive integer, (b) laying out an even via row of m+1 vias directly below each odd I/O pad row, and (c) laying out an odd via row of m−1 vias directly below each even I/O pad row. A ball grid array package includes an even I/O pad row and an odd I/O pad row of m I/O pads each wherein m is a positive integer, an even via row of m+1 vias directly below each odd I/O pad row, and an odd via row of m−1 vias directly below each even I/O pad row.

12 Claims, 3 Drawing Sheets

METHOD FOR INCREASING TRACE ROWS OF A BALL GRID ARRAY

BACKGROUND OF THE INVENTION

The present invention relates to methods for packaging integrated circuits. More specifically, but without limitation thereto, the present invention relates to a method for increasing the number of traces of a ball grid array integrated circuit package.

A typical ball grid array limits the number of I/O traces to a ball grid of four rows. As circuits evolve with increasing complexity, higher ball counts are needed. A problem with the current limitation of four rows is that the standard design parameters of trace width, trace spacing, via diameter, and I/O pad diameter would have to be changed to accommodate a higher number of traces.

SUMMARY OF THE INVENTION

The present invention advantageously addresses the problems above as well as other problems by providing a method for increasing the number of traces for a ball grid array package without changing the standard design parameters.

In one embodiment, the present invention may be characterized as a method of making a ball grid array package that includes the steps of (a) laying out an even I/O pad row and an odd I/O pad row of m I/O pads each for a ball grid array package wherein m is a positive integer, (b) laying out an even via row of m+1 vias directly below each odd I/O pad row, and (c) laying out an odd via row of m−1 vias directly below each even I/O pad row.

In another embodiment, the present invention may be charcterized as a ball grid array package that includes an even I/O pad row and an odd I/O pad row of m I/O pads each wherein m is a positive integer, an even via row of m+1 vias directly below each odd I/O pad row, and an odd via row of m−1 vias directly below each even I/O pad row.

BRIEF DESCRIPTION OF THE DRAWINGS

The above and other aspects, features and advantages of the present invention will be more apparent from the following more specific description thereof, presented in conjunction with the following drawings wherein.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

Figure 1:
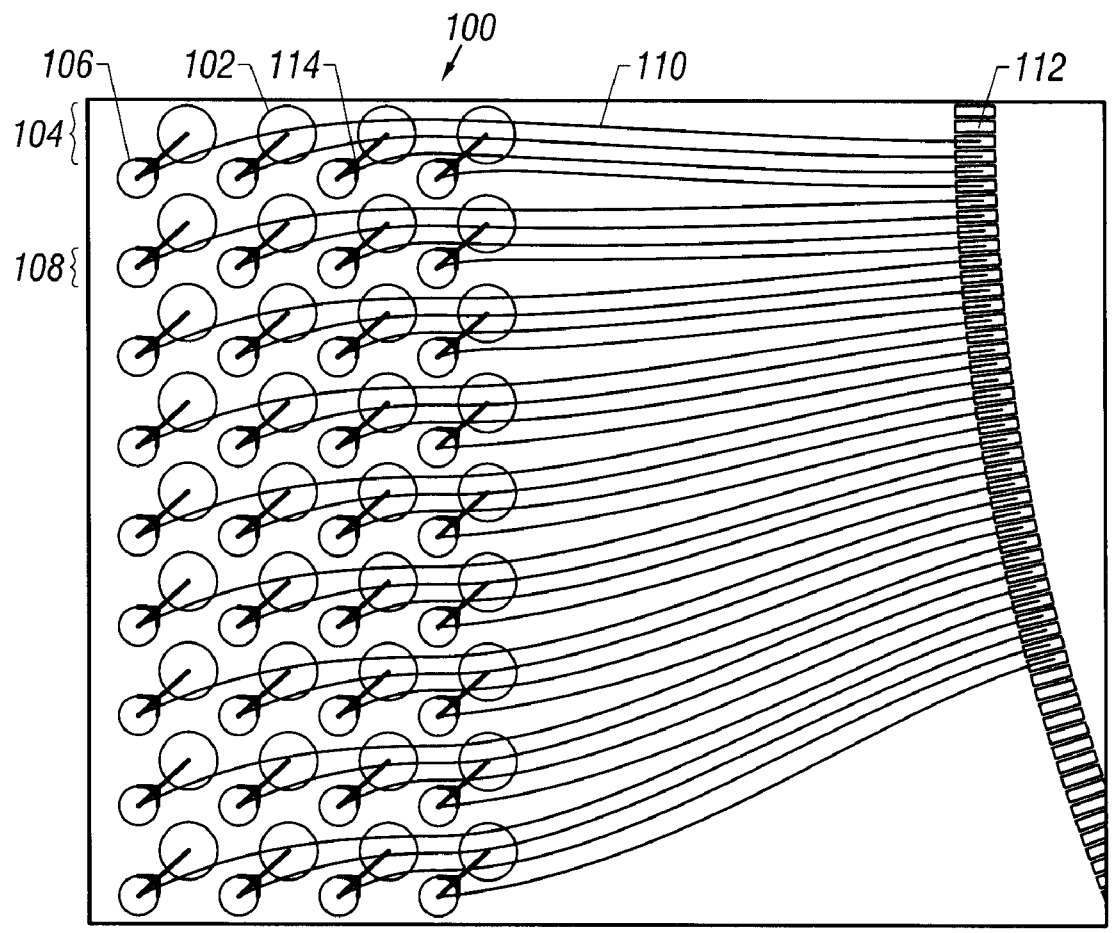
FIG. 1 is a diagram of a typical ball grid array package layout of the prior art.

FIG. 1 is a diagram of a typical ball grid array package layout 100 of the prior art. Shown in FIG. 1 are I/O pads 102, I/O pad rows 104, vias 106, via rows 108, interconnect traces 110, bondfingers 112, and via traces 114. The bondfingers 112 connect the interconnect wires or traces 110 to an integrated circuit die (not shown).

Exemplary standard design parameters for the ball grid array package layout 100 are a trace width of 70 microns, a trace spacing of 70 microns, a via diameter of 450 microns, and an I/O pad diameter of 640 microns.

The I/O pads 102 are arranged in groups of four in each of the I/O pad rows 104. Below each of the I/O pad rows 104 is a via row 108. The vias 106 are arranged in groups of four in each of the via rows 108. The via traces 114 are routed from the four I/O pads 102 in each of the I/O pad rows 104 to the four vias 106 in the via row 108 directly below each of the I/O pad rows 104. Each of the vias 106 provides an electrical connection from a routing layer to the bondfinger layer in the ball grid array package layout 100. The interconnect traces 110 connect each of the four vias 106 in the via row 108 to four of the bondfingers 112 in the bondfinger layer of the ball grid array package layout 100. By this method, a set of four I/O pad rows 104 provide connections to 16 of the bondfingers 112. The increased complexity of integrated circuits has placed greater demands on the number of I/O interconnects, however. A layout that provides an increased number of I/O interconnects using standard design parameters is shown in FIG. 2.

Figure 2:
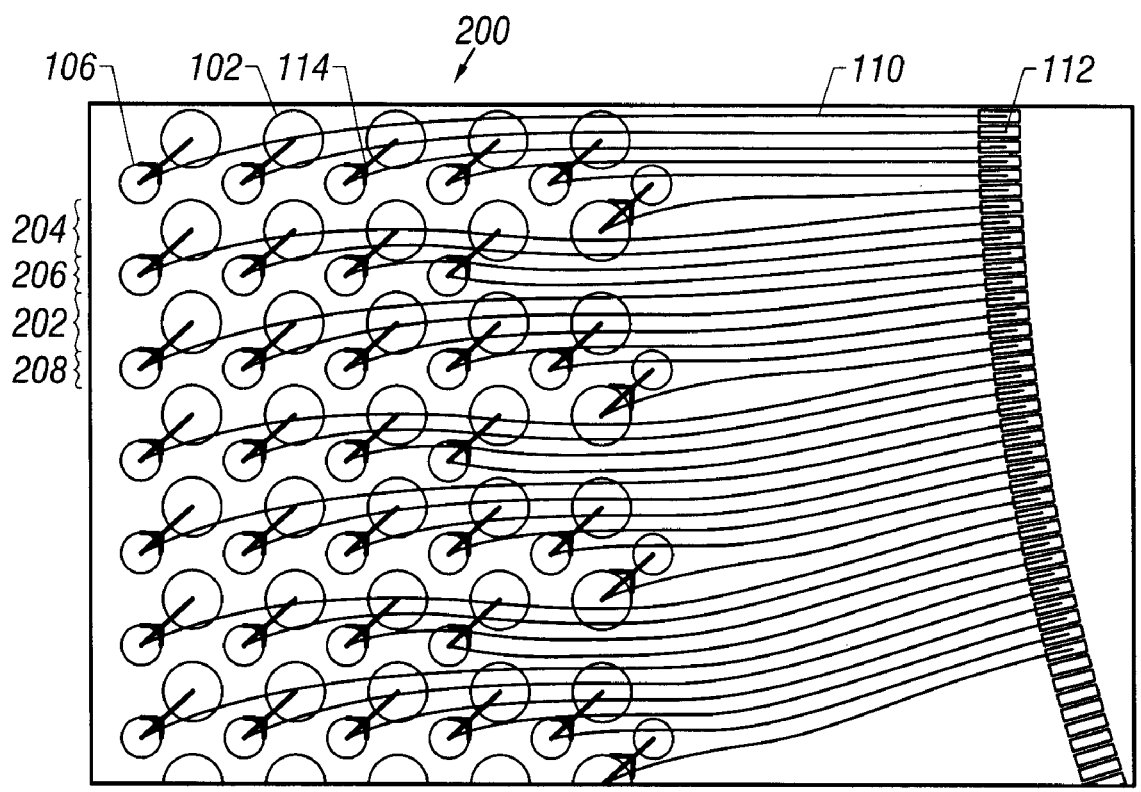
FIG. 2 is a diagram of a ball grid array package layout according to an embodiment of the present invention.

FIG. 2 is a diagram of a ball grid array package layout 200 that provides an increase of 25 percent in the number of I/O interconnects without changing the standard design parameters. Shown in FIG. 2 are I/O pads 102, vias 106, interconnect traces 110, bondfingers 112, via traces 114, odd I/O pad rows 202, even I/O pad rows 204, odd via rows 206, and even via rows 208. The terms "odd" and "even" are used in this context only to distinguish alternating rows of I/O pads, alternating rows of vias, and alternating groups of bondfingers and have no numerical significance.

In this example, the I/O pads 102 are arranged in a layout of five in each of the even I/O pad rows 204 and the odd I/O pad rows 202. Directly below each of the odd I/O pad rows 202 is an even via row 208, and directly below each of the even I/O pad rows 204 is an odd via row 206.

The vias 108 are arranged in a layout of four in each of the odd via rows 206 directly below each of the even I/O pad rows 204 and in a layout of six in each of the even via rows 208 directly below each of the odd I/O pad rows 202.

The via traces 114 are routed respectively from five I/O pads 102 of each of the odd I/O pad rows 202 to five vias 106 in the even via row 208 directly below. From each of the even I/O pad rows 204, four via traces 114 are routed respectively from four I/O pads 102 to four vias 106 in the odd via row 206 directly below. A fifth via trace 114 is routed from a fifth I/O pad 102 of each of the even I/O pad rows 204 to a sixth via 106 in the even via row 208 directly above the I/O pad 204. Each of the vias 106 provides an electrical connection from a routing layer to the bondfinger layer of the ball grid array package layout 100. The interconnect traces 110 connect the vias 106 to the bondfingers 112.

The layout described above for FIG. 2 may be generalized to further increase the number of interconnects by substituting a positive integer m for five, m−1 for four, and m+1 for six in the description of the method above and then using a value for m greater than five to generate a new layout. Using values for m greater than five may require changing the standard parameters, however.

Figure 3:
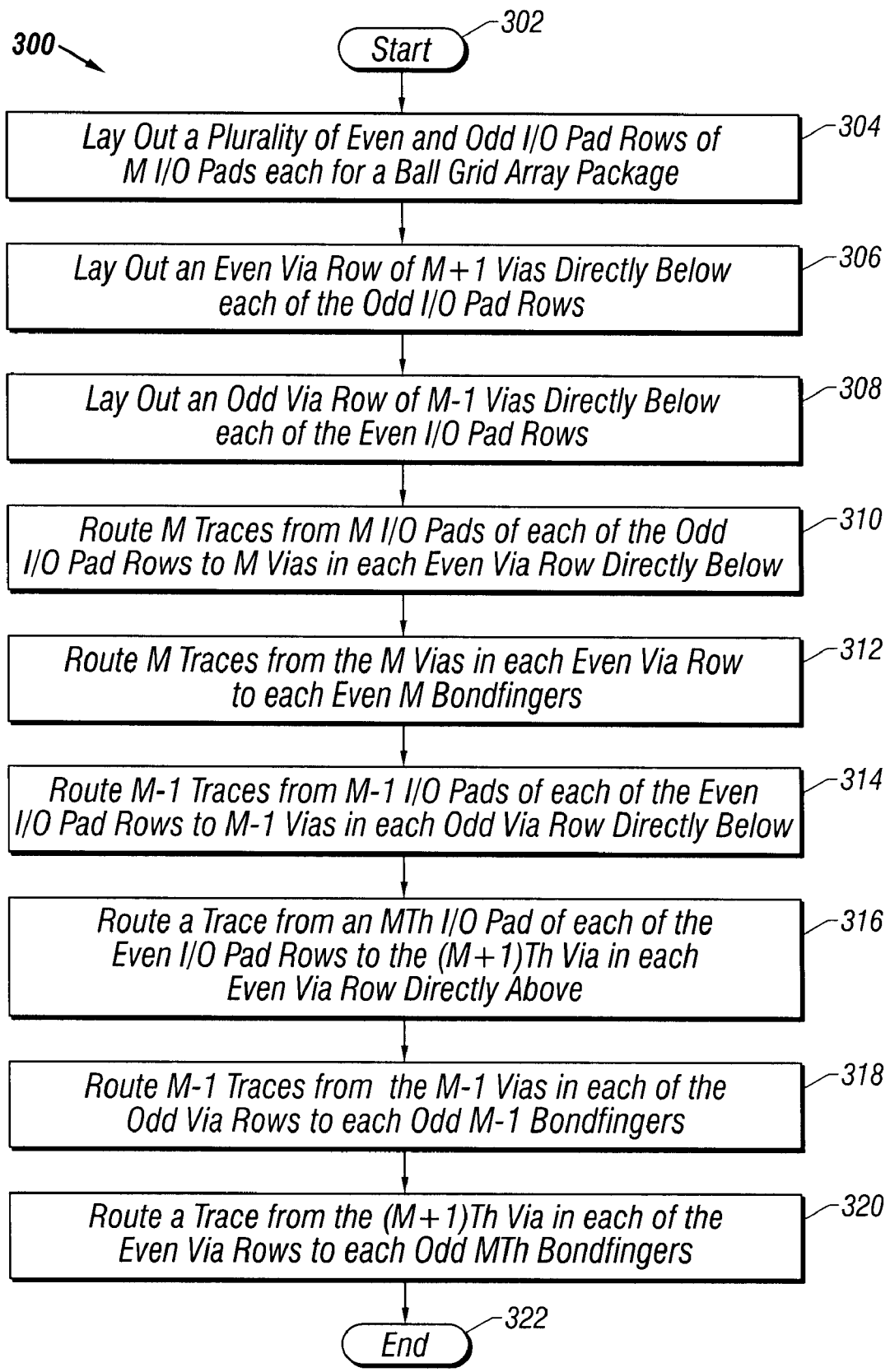
FIG. 3 is a flowchart of a method for making the ball grid array package shown in the layout of FIG. 2.

FIG. 3 is a flowchart 300 of a method for making the ball grid array package 200 shown in the layout of FIG. 2.

Step 302 is the entry point for the flowchart 300.

Step 304 lays out a plurality of even and odd I/O pad rows of m I/O pads each for a ball grid array package wherein m is a positive integer.

Step 306 lays out an even via row of m+1 vias directly below each of the odd I/O pad rows.

Step 308 lays out an odd via row of m−1 vias directly below each of the even I/O pad rows.

Step 310 routes m traces from m I/O pads of each of the odd I/O pad rows to m vias in each even via row directly below.

Step 312 routes m traces from the m vias in each even via row to each even m bondfingers.

Step 314 routes m−1 traces from m−1 I/O pads of each of the even I/O pad rows to m−1 vias in each odd via row directly below.

Step 316 routes a trace from an mth I/O pad of each of the even I/O pad rows to the (m+1)th via in each even via row directly above.

Step 318 routes m−1 traces from the m−1 vias in each odd via row to each odd m−1 bondfingers.

Step 320 routes a trace from the (m+1)th via to each odd mth bondfinger. Step 322 is the exit point for the flowchart 300.

By adding an additional I/O pad in the layout of each I/O pad row and laying out the via rows with an alternating number of vias between each of the I/O pad rows, an increase of 25 percent in the I/O interconnect count is realized using standard design parameters.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of making a ball grid array package comprising the steps of:

(a) laying out an even I/O pad row and an odd I/O pad row of m I/O pads each for a ball grid array package wherein m is a positive integer;

(b) laying out an even via row of m+1 vias directly below each odd I/O pad row; and (c) laying out an odd via row of m−1 vias directly below each even I/O pad row.

2. The method of claim 1 further comprising the step of (d) routing m traces from m I/O pads of each odd I/O pad row to m vias in each even via row directly below.

3. The method of claim 2 further comprising the step of (e) routing m traces respectively from the m vias in each even via row to each even m bondfingers.

4. The method of claim 3 further comprising the step of (f) routing m−1 traces respectively from m−1 I/O pads of each even I/O pad row to m−1 vias in each odd via row directly below.

5. The method of claim 4 further comprising the step of (g) routing m−1 traces from the m−1 vias in each odd via row to each odd m−1 bondfingers.

6. The method of claim 5 further comprising the step of (h) routing a trace from an mth I/O pad of each even I/O pad row to an (m+1)th via in each even via row directly above.

7. The method of claim 6 further comprising the step of (h) routing a trace from the (m+1)th via in each even via row to each odd mth bondfinger.

8. The method of claim 1 wherein m equals five.

9. The method of claim 1 wherein trace width is 70 microns.

10. The method of claim 1 wherein trace spacing is 70 microns.

11. The method of claim 1 wherein via diameter is 450 microns.

12. The method of claim 1 wherein I/O pad diameter is 640 microns.

* * * * *